United States Patent
Wang

(10) Patent No.: US 10,291,771 B2
(45) Date of Patent: May 14, 2019

(54) METHOD FOR MANAGING ELECTRIC QUANTITY OF BATTERY, MOBILE TERMINAL AND COMPUTER STORAGE MEDIUM

(71) Applicant: NUBIA TECHNOLOGY CO., LTD., Shenzhen, Guangdong (CN)

(72) Inventor: Shuai Wang, Shenzhen (CN)

(73) Assignee: NUBIA Technology Co., LTD. (CN)

( * ) Notice: Subject to any disclaimer, the term of this patent is extended or adjusted under 35 U.S.C. 154(b) by 5 days.

(21) Appl. No.: 15/519,066

(22) PCT Filed: Aug. 28, 2015

(86) PCT No.: PCT/CN2015/088382
§ 371 (c)(1),
(2) Date: Apr. 13, 2017

(87) PCT Pub. No.: WO2016/058458
PCT Pub. Date: Apr. 21, 2016

(65) Prior Publication Data
US 2017/0223180 A1    Aug. 3, 2017

(30) Foreign Application Priority Data
Oct. 15, 2014   (CN) .......................... 2014 1 0546544

(51) Int. Cl.
*H04M 1/73*      (2006.01)
*G01R 31/36*    (2019.01)
(Continued)

(52) U.S. Cl.
CPC .............. *H04M 1/73* (2013.01); *G01R 31/36* (2013.01); *G01R 31/3606* (2013.01);
(Continued)

(58) Field of Classification Search
CPC .................................. H04M 1/73; G01R 31/36
(Continued)

(56) References Cited

U.S. PATENT DOCUMENTS

| 6,765,369 | B2 * | 7/2004 | Rhee ..................... H02J 7/0063 |
| | | | 320/132 |
| 2012/0058805 | A1 | 3/2012 | Yoo | |
| 2014/0055087 | A1 * | 2/2014 | Causey .................. H02J 7/025 |
| | | | 320/108 |

FOREIGN PATENT DOCUMENTS

CN        102299992 A     12/2011
CN        103312866 A      9/2013
(Continued)

OTHER PUBLICATIONS

International Search Report in International Application No. PCT/CN2015/088382, dated Nov. 19, 2015, 2 pages.
(Continued)

*Primary Examiner* — Ankur Jain
(74) *Attorney, Agent, or Firm* — Eric L. Sophir; Dentons US LLP

(57) ABSTRACT

Disclosed is a method for managing the electric quantity of a battery. The method comprises: acquiring a current electric quantity value and a current voltage value; when the electric quantity value saved last time is not a power-off electric quantity, judging whether the current electric quantity value is the power-off electric quantity; when the current electric quantity value is the power-off electric quantity, comparing the current voltage value with a preset first power-off voltage; if the current voltage value is less than or equal to the first power-off voltage, judging whether the current voltage value is continuously greater than a second power-off voltage within the preset number of times; and if the current voltage value is less than or equal to the second power-off voltage within the preset number of times, con-
(Continued)

trolling a mobile terminal system to power off. Also disclosed are a mobile terminal and a computer storage medium.

19 Claims, 10 Drawing Sheets

(51) Int. Cl.
*G01R 31/44* (2006.01)
*H04M 1/725* (2006.01)
*H04W 52/02* (2009.01)

(52) U.S. Cl.
CPC ........ *G01R 31/44* (2013.01); *H04M 1/72522* (2013.01); *H04W 52/0277* (2013.01); *H04W 52/0296* (2013.01); *Y02D 70/00* (2018.01); *Y02D 70/1242* (2018.01); *Y02D 70/1244* (2018.01); *Y02D 70/1262* (2018.01); *Y02D 70/142* (2018.01); *Y02D 70/144* (2018.01); *Y02D 70/146* (2018.01); *Y02D 70/162* (2018.01); *Y02D 70/164* (2018.01); *Y02D 70/166* (2018.01); *Y02D 70/168* (2018.01)

(58) Field of Classification Search
USPC ........................................................ 455/574
See application file for complete search history.

(56) References Cited

FOREIGN PATENT DOCUMENTS

| | | |
|---|---|---|
| CN | 103440029 A | 12/2013 |
| CN | 103718618 A | 4/2014 |
| CN | 103905645 A | 7/2014 |
| CN | 104301547 A | 1/2015 |
| KR | 20120025274 A | 3/2012 |

OTHER PUBLICATIONS

English Translation of the Written Opinion of the International Search Authority in International Application No. PCT/CN2015/088382, dated Nov. 19, 2015, 7 pages.

English Translation of Notification of the First Office Action of Chinese Application No. 201410546544.8, dated Jul. 1, 2015, 6 pages.

* cited by examiner

METHOD FOR MANAGING ELECTRIC QUANTITY OF BATTERY, MOBILE TERMINAL AND COMPUTER STORAGE MEDIUM

CROSS-REFERENCE TO RELATED APPLICATIONS

This application is a 371 of International Patent Application No. PCT/CN2015/088382, filed Aug. 28, 2015, which claims priority to Chinese Patent Application No. 201410546544.8, filed Oct. 15, 2014, all of which are incorporated by reference in their entirety.

TECHNICAL FIELD

The present disclosure relates to the technical field of smart terminals, and in particular to a battery level management method, a mobile terminal, and a computer storage medium.

BACKGROUND

At present, a mobile terminal may be controlled to power off by determining battery level of a battery. As for this mobile terminal, a certain error probably exists during calculation of the battery level. For example, in a power-on process of the mobile terminal, due to fluctuation of a battery voltage, the voltage may reach a power-off voltage, which makes a system powered off in advance. Or, in a usage process of the mobile terminal, when a load current is heavier, the battery voltage will be pulled down, and when the pulled-down battery voltage reaches the power-off voltage, the system is powered off in advance. Thus, an actual power-off voltage of the mobile terminal is relatively high, and the battery actually has some remaining electricity that cannot be utilized, so that the battery electricity of the mobile terminal cannot be fully utilized, thereby influencing the use experience of a user.

SUMMARY

Embodiments of the present disclosure are intended to provide a battery level management method, a mobile terminal, and a computer storage medium, capable of accurately determining the power-off battery level of a mobile terminal, making the battery electricity fully utilized and improving the use experience of a user.

An embodiment of the present disclosure provides a battery level management method, including the following steps.

A current battery level and a current voltage are acquired;

when a battery level saved last time is not a power-off battery level, it is determined whether the current battery level is the power-off battery level;

when the current battery level is the power-off battery level, the current voltage is compared with a preset first power-off voltage;

if the current voltage is smaller than or equal to the first power-off voltage, it is determined successively for a preset number of times whether the current voltage is greater than a second power-off voltage; and if there is a time among the preset number of times that the current voltage is smaller than or equal to the second power-off voltage, a system of a mobile terminal is controlled to power off.

Based on the above-mentioned solution, after the current battery level and the current voltage are acquired, the battery level management method may further include the following step:

it is determined whether an external power supply device is connected, and if not, it is determined whether the battery level saved last time is the power-off battery level.

Based on the above-mentioned solution, after it is determined whether the battery level saved last time is the power-off battery level, the battery level management method may further include the following step:

when the battery level saved last time is the power-off battery level, the system of the mobile terminal is controlled to power off.

Based on the above-mentioned solution, after the current voltage is compared with the preset first power-off voltage, the battery level management method may further include the following step:

if the current voltage is greater than the first power-off voltage, the current battery level is set as minimum non-power-off battery level, and the system is prohibited from powering off.

Based on the above-mentioned solution, after it is determined successively for the preset number of times whether the current voltage is greater than the second power-off voltage, the battery level management method may further include the following step:

if the current voltage is determined successively for the preset number of times to be greater than the second power-off voltage, the current battery level is set as the minimum non-power-off battery level, and the system is prohibited from powering off.

An embodiment of the present disclosure further provides a mobile terminal, including:

a battery level acquisition module configured to acquire a current battery level and a current voltage;

a first determination module configured to, when a battery level saved last time is not power-off battery level, determine whether the current battery level is the power-off battery level;

a comparison module configured to, when the current battery level is the power-off battery level, compare the current voltage with a preset first power-off voltage;

a second determination module configured to, if the current voltage is smaller than or equal to the first power-off voltage, determine successively for a preset number of times whether the current voltage is greater than a second power-off voltage; and a first control module configured to, if there is a time among the preset number of times that the current voltage is smaller than or equal to the second power-off voltage, control a system of the mobile terminal to power off.

Based on the above-mentioned solution, the mobile terminal may further include:

a third determination module configured to determine whether an external power supply device is connected; and a fourth determination module configured to, when the mobile terminal is not connected with the external power supply device, determine whether the battery level saved last time is the power-off battery level.

Based on the above-mentioned solution, the mobile terminal may further include:

a second control module configured to, when the battery level saved last time is the power-off battery level, control the system of the mobile terminal to power off.

Based on the above-mentioned solution, the mobile terminal may further include:

a first setting module configured to, if the current voltage is greater than the first power-off voltage, set the current battery level as minimum non-power-off battery level, and prohibit the system from powering off.

Based on the above-mentioned solution, the mobile terminal may further include:

a second setting module configured to, if the current voltage is determined successively for the preset number of times to be greater than the second power-off voltage, set the current battery level as the minimum non-power-off battery level, and prohibit the system from powering off.

An embodiment of the present disclosure further provides another battery level management method, including the following steps.

A current battery level and a current voltage are acquired, and when a battery level saved last time is not power-off battery level, it is determined whether the current battery level is the power-off battery level;

when the current battery level is the power-off battery level, the current voltage is compared with a preset first power-off voltage;

if the current voltage is smaller than or equal to the first power-off voltage, it is determined whether the current voltage is greater than a second power-off voltage for successive N times, N being an integer not smaller than 2; and if the current voltage is smaller than the second power-off voltage at least once, a system of a mobile terminal is controlled to power off.

Based on the above-mentioned solution, the method may further include the following step:

a time interval is acquired; and the step that the current battery level and the current voltage are acquired may include that: the current battery level and the current voltage are acquired once at each time interval.

Based on the above-mentioned solution, a value of the first power-off voltage may be greater than a value of the second power-off voltage.

Based on the above-mentioned solution, the method may further include the following step:

if the current voltage is not smaller than the second power-off voltage for successive N times, the mobile terminal is controlled to turn from a first working state to a second working state, herein the electricity consumption of the mobile terminal working in the first working state is greater than the electricity consumption of the mobile terminal working in the second working state.

Based on the above-mentioned solution, a working state of the mobile terminal may include a power-on state and a power-off state; and the first working state and the second working state may both be sub-states under the power-on state.

Based on the above-mentioned solution, the method may further include the following steps:

it is determined whether the mobile terminal is connected to an external power supply device;

a power supply rate of the external power supply device is determined.

the mobile terminal is controlled, according to the power supply rate, to be switched between the first working state and the second working state.

Based on the above-mentioned solution, the step that the mobile terminal is controlled according to the power supply rate to be switched between the first working state and the second working state may include that:

if the power supply rate is smaller than a specified rate, the mobile terminal is kept to work in the second working state within a specified period of time, and the working state of the mobile terminal is switched to the first working state after the specified period of time elapses.

Based on the above-mentioned solution, if the power supply rate is not smaller than the specified rate, the working state of the mobile terminal may be switched to the first working state.

Based on the above-mentioned solution, the method may further include the following steps:

if the current voltage is not smaller than the second power-off voltage for successive N times, the system of the mobile terminal is prohibited from powering off.

The embodiments of the present disclosure also provide a computer storage medium having stored therein computer-executable instructions configured to execute the above-mentioned method.

According to the battery level management method, the mobile terminal and the computer storage medium provided by the embodiments of the present disclosure, when the current battery level is acquired and it is determined that the battery level saved last time is not the power-off battery level, it is determined whether the current battery level is the power-off battery level, if so, the current voltage is compared with the preset first power-off voltage, if the current battery level is smaller than or equal to the first power-off voltage, it is determined successively for the preset number of times whether the current battery level is greater than the second power-off voltage, and if not so, the system of the mobile terminal is controlled to power off. The acquired current battery level is compared with the first power-off voltage and the second power-off voltage, and a corresponding criterion is set to determine whether to control the system of the mobile terminal to power off. The power-off battery level of the mobile terminal can be accurately determined, so that the battery electricity can be fully utilized, and the use experience of a user is improved.

DETAILED DESCRIPTION

An information processing method of the present embodiment may be applied to various types of electronic devices. The electronic devices of the present embodiment may include various types of mobile terminals or fixed terminals.

The mobile terminal according to embodiments of the present disclosure will now be described with reference to the accompanying drawings. In the following description, usage of suffixes such as 'module', 'part' or 'unit' used for referring to elements is given merely to facilitate explanation of the present disclosure, without having any significant meaning by itself. Accordingly, the 'module' and 'part' may be mixedly used.

Mobile terminals may be implemented in various forms. For example, the terminal described in the present disclosure may include mobile terminals such as mobile phones, smart phones, notebook computers, digital broadcast receivers, PDAs (Personal Digital Assistants), PMPs (Portable Multimedia Player), navigation devices, and the like, and fixed terminals such as digital TVs, desk top computers and the like. Hereinafter, it is assumed that the terminal is a mobile terminal. However, it would be understood by a person in the art that the configuration according to the embodiments of the present disclosure can be also applicable to the fixed types of terminals, except for any elements especially configured for a mobile purpose.

Figure 9:
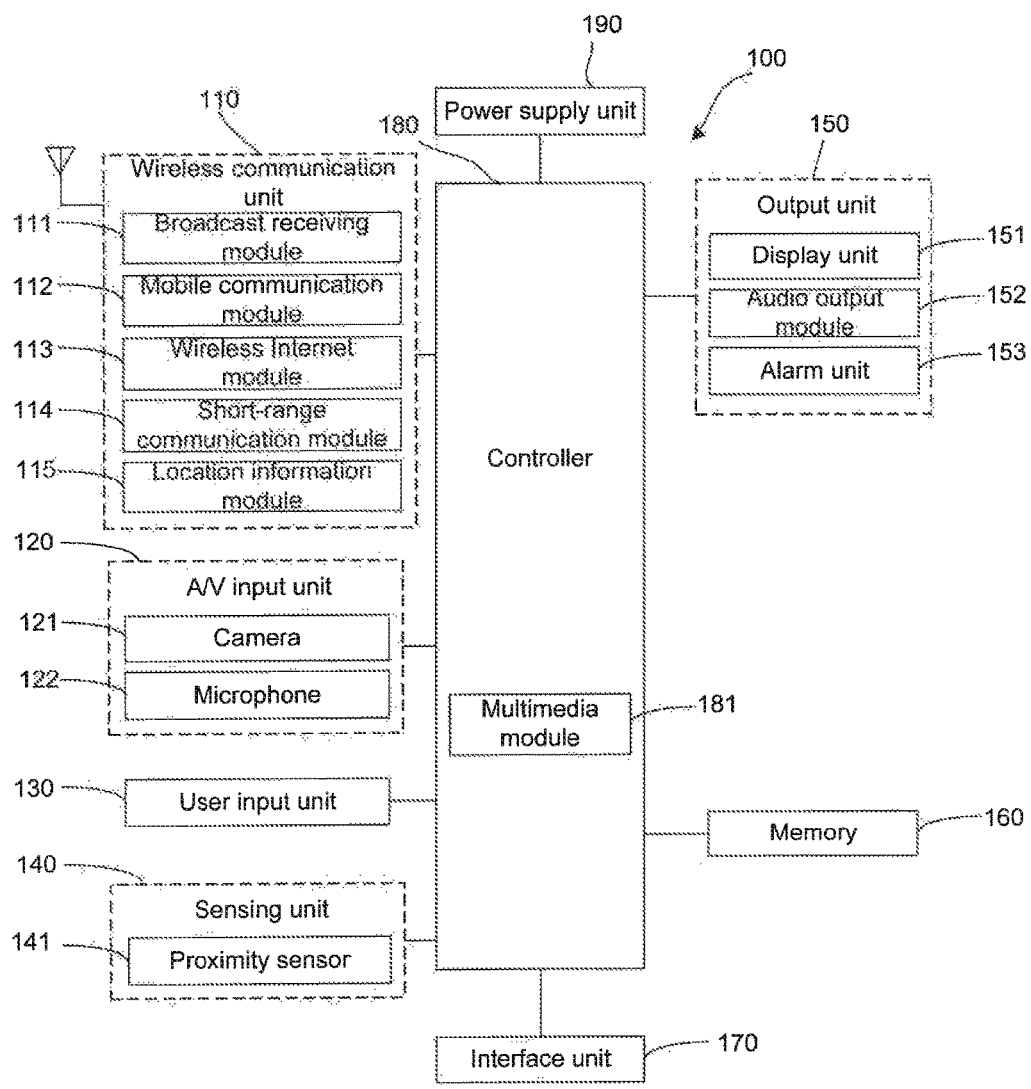
FIG. 9 is a structure diagram of a mobile terminal provided by an embodiment of the present disclosure.

FIG. 9 is a hardware structure diagram of a mobile terminal according to embodiments of the present disclosure.

The mobile terminal 100 may include a wireless communication unit 110, an A/V (Audio/Video) input unit 120, a user input unit 130, a sensing unit 140, an output unit 150, a memory 160, an interface unit 170, a controller 180, a power supply unit 190 and the like. FIG. 9 shows the mobile terminal as having various components, but it should be understood that implementing all of the illustrated components is not a requirement. Greater or fewer components may alternatively be implemented. Elements of the mobile terminal will be described hereinbelow in detail.

The wireless communication unit 110 typically includes one or more components allowing radio communication between the mobile terminal 100 and a wireless communication system or a network in which the mobile terminal is located. For example, the wireless communication unit may include at least one of a broadcast receiving module 111, a mobile communication module 112, a wireless Internet module 113, a short-range communication module 114, and a location information module 115.

The broadcast receiving module 111 receives broadcast signals and/or broadcast associated information from an external broadcast management server via a broadcast channel. The broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal combined with a TV or radio broadcast signal. The broadcast associated information may also be provided via a mobile communication network and, in this instance, the broadcast associated information may be received by the mobile communication module 112. The broadcast signal may exist in various forms. For example, it may exist in the form of an electronic program guide (EPG) of digital multimedia broadcasting (DMB), electronic service guide (ESG) of digital video broadcast-handheld (DVB-H), and the like. The broadcast receiving module 111 may be configured to receive signals broadcast by using various types of broadcast systems. In particular, the broadcast receiving module 111 may receive a digital broadcast by using a digital broadcast system such as multimedia broadcasting-terrestrial (DMB-T), digital multimedia broadcasting-satellite (DMB-S), digital video broadcast-handheld (DVB-H), the data broadcasting system known as media forward link only (MediaFLO®), integrated services digital broadcast-terrestrial (ISDB-T), etc. The broadcast receiving module 111 may be configured to be suitable for every broadcast system that provides a broadcast signal as well as the above-mentioned digital broadcast systems. Broadcast signals and/or broadcast-associated information received via the broadcast receiving module 111 may be stored in the memory 160 (or another type of storage medium).

The mobile communication module 112 transmits and/or receives radio signals to and/or from at least one of a base station (e.g., access point, Node B, etc.), an external terminal and a server. Such radio signals may include a voice call signal, a video call signal or various types of data according to text and/or multimedia message transmission and/or reception.

The wireless Internet module 113 supports wireless Internet access for the mobile terminal. This module may be internally or externally coupled to the terminal. The wireless Internet access technique implemented may include a WLAN (Wireless LAN) (Wi-Fi), Wibro (Wireless broadband), Wimax (World Interoperability for Microwave Access), HSDPA (High Speed Downlink Packet Access), or the like.

The short-range communication module 114 is a module for supporting short range communications. Some examples of short-range communication technology include Bluetooth™, Radio Frequency IDentification (RFID), Infrared Data Association (IrDA), Ultra-WideBand (UWB), ZigBee™, and the like.

The location information module 115 is a module for checking or acquiring a location (or position) of the mobile terminal. A typical example of the location information module is a GPS (Global Positioning System). According to the current technology, the GPS module 115 calculates distance information from three or more satellites and accurate time information and applies trigonometry to the calculated information to thereby accurately calculate three-dimensional current location information according to latitude, longitude, and altitude. Currently, a method for calculating location and time information by using three satellites and correcting an error of the calculated location and time information by using another one satellite. In addition, the GPS module 115 can calculate speed information by continuously calculating the current location in real time.

The A/V input unit 120 is configured to receive an audio or video signal. The A/V input unit 120 may include a camera 121 and a microphone 122. The camera 121 processes image data of still pictures or video obtained by an image capture device in a video capturing mode or an image capturing mode. The processed image frames may be displayed on a display unit 151. The image frames processed by the camera 121 may be stored in the memory 160 (or other storage medium) or transmitted via the wireless communication unit 110. Two or more cameras 121 may be provided according to the configuration of the mobile terminal. The microphone 122 may receive sounds (audible data) via a microphone in a phone call mode, a recording mode, a voice recognition mode, and the like, and can process such sounds into audio data. The processed audio (voice) data may be converted for output into a format transmittable to a mobile communication base station via the mobile communication module 112 during the phone call mode. The microphone 122 may implement various types of noise canceling (or suppression) algorithms to cancel (or suppress) noise or interference generated in the course of receiving and transmitting audio signals.

The user input unit 130 may generate key input data from commands entered by a user to control various operations of the mobile terminal. The user input unit 130 allows the user to enter various types of information, and may include a keypad, a dome switch, a touch pad (e.g., a touch sensitive member that detects changes in resistance, pressure, capacitance, etc. due to being contacted) a jog wheel, a jog switch, and the like. In particular, when the touch pad is overlaid on the display unit 151 in a layered manner, it may form a touch screen.

The sensing unit 140 detects a current status of the mobile terminal 100 such as an opened or closed state of the mobile terminal 100, a location of the mobile terminal 100, the presence or absence of user contact with the mobile terminal 100 (i.e., touch inputs), the orientation of the mobile terminal 100, an acceleration or deceleration movement and direction of the mobile terminal 100, etc., and generates commands or signals for controlling the operation of the mobile terminal 100. For example, when the mobile terminal 100 is implemented as a slide type mobile phone, the sensing unit 140 may sense whether the slide phone is opened or closed. In addition, the sensing unit 140 can detect whether or not the power supply unit 190 supplies power or whether or not the interface unit 170 is coupled with an external device. The sensing unit 140 may include a proximity sensor 141. This will be described in relation to a touch screen later.

The interface unit 170 serves as an interface by which at least one external device may be connected with the mobile terminal 100. For example, the external devices may include wired or wireless headset ports, an external power supply (or battery charger) ports, wired or wireless data ports, memory card ports, ports for connecting a device having an identification module, audio input/output (I/O) ports, video I/O ports, earphone ports, or the like. The identification module may be a memory chip that stores various information for authenticating a user's authority for using the mobile terminal 100 and may include a user identity module (UIM), a subscriber identity module (SIM) a universal subscriber identity module (USIM), and the like. In addition, the device having the identification module (referred to as the 'identifying device', hereinafter) may take the form of a smart card. Accordingly, the identifying device may be connected with the terminal 100 via a port or other connection means. The interface unit 170 may be used to receive inputs (e.g., data, information, power, etc.) from an external device and transfer the received inputs to one or more elements within the mobile terminal 100 or may be used to transfer data between the mobile terminal and an external device.

In addition, when the mobile terminal 100 is connected with an external cradle, the interface unit 170 may serve as a conduit to allow power from the cradle to be supplied therethrough to the mobile terminal 100 or may serve as a conduit to allow various command signals input from the cradle to be transferred to the mobile terminal therethrough. Various command signals or power input from the cradle may be operated as a signal for recognizing that the mobile terminal is accurately mounted on the cradle. The output unit 150 is configured to provide outputs in a visual, audible, and/or tactile manner (e.g., audio signal, video signal, alarm signal, vibration signal, etc.). The output unit 150 may include the display unit 151, an audio output module 152, an alarm unit 153, and the like.

The display unit 151 may display information processed in the mobile terminal 100. For example, when the mobile terminal 100 is in a phone call mode, the display unit 151 may display a User Interface (UI) or a Graphic User Interface (GUI) associated with a call or other communication (such as text messaging, multimedia file downloading, etc.). When the mobile terminal 100 is in a video call mode or image capturing mode, the display unit 151 may display a captured image and/or received image, a UI or GUI that shows videos or images and functions related thereto, and the like.

Meanwhile, when the display unit 151 and the touch pad are overlaid in a layered manner to form a touch screen, the display unit 151 may function as both an input device and an output device. The display unit 151 may include at least one of a Liquid Crystal Display (LCD), a Thin Film Transistor-LCD (TFT-LCD), an Organic Light Emitting Diode (OLED) display, a flexible display, a three-dimensional (3D) display, or the like. Some of them may be configured to be transparent to allow viewing of the exterior, which may be called transparent displays. A typical transparent display may be, for example, a TOLED (Transparent Organic Light Emitting Diode) display, or the like. The mobile terminal 100 may include two or more display units (or other display means) according to its particular desired embodiment. For example, the mobile terminal may include both an external display unit and an internal display unit. The touch screen may be configured to detect even a touch input pressure as well as a touch input position and a touch input area.

The audio output module 152 may convert and output as sound audio data received from the wireless communication unit 110 or stored in the memory 160 in a call signal reception mode, a call mode, a record mode, a voice recognition mode, a broadcast reception mode, and the like. Also, the audio output module 152 may provide audible outputs related to a particular function performed by the mobile terminal 100 (e.g., a call signal reception sound, a message reception sound, etc.). The audio output module 152 may include a speaker, a buzzer, or the like.

The alarm unit 153 may provide outputs to inform about the occurrence of an event of the mobile terminal 100. Typical events may include call reception, message reception, key signal inputs, a touch input etc. In addition to audio or video outputs, the alarm unit 153 may provide outputs in a different manner to inform about the occurrence of an event. For example, the alarm unit 153 may provide an output in the form of vibrations. When a call, a message, or some other incoming communication is received, the alarm unit 153 may provide tactile outputs (i.e., vibrations) to inform the user thereof. By providing such tactile outputs, the user can recognize the occurrence of various events even if his mobile phone is in the user's pocket. Outputs informing about the occurrence of an event may be also provided via the display unit 151 or the audio output module 152.

The memory 160 may store software programs or the like used for the processing and controlling operations performed by the controller 180, or may temporarily store data (e.g., a phonebook, messages, still images, video, etc.) that have been output or which are to be output. Also, the memory 160 may store data regarding various patterns of vibrations and audio signals output when a touch is applied to the touch screen.

The memory 160 may include at least one type of storage medium including a Flash memory, a hard disk, a multimedia card, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only Memory (PROM), a magnetic memory, a magnetic disk, an optical disk, and the like. Also, the mobile terminal 100 may cooperate with a network storage device that performs the storage function of the memory 160 over a network connection.

The controller 180 typically controls the general operations of the mobile terminal. For example, the controller 180 performs controlling and processing associated with voice calls, data communications, video calls, and the like. In addition, the controller 180 may include a multimedia module 181 for reproducing (or playing back) multimedia data. The multimedia module 181 may be configured within the controller 180 or may be configured to be separate from the controller 180. The controller 180 may perform a pattern recognition processing to recognize a handwriting input or a picture drawing input performed on the touch screen as characters or images.

The power supply unit 190 receives external power or internal power and supplies appropriate power required for operating respective elements and components under the control of the controller 180.

Various embodiments as described herein may be implemented in a computer-readable medium using, for example, computer software, hardware, or any combination thereof. For hardware implementation, the embodiments described herein may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic units designed to perform the functions described herein. In some instances, such embodiments may be implemented in the controller 180. For software implementation, the embodiments such as procedures or functions may be implemented together with separate software modules that allow performing of at least one function or operation. Software codes can be implemented by a software application (or program) written in any suitable programming language. The software codes may be stored in the memory 160 and executed by the controller 180.

So far, the mobile terminal has been described from the perspective of its functions. Hereinafter, a slide-type mobile terminal, among various types of mobile terminal such as folder-type, bar-type, swing-type, slide type mobile terminals, or the like, will be described as an example for the sake of brevity. Thus, the present disclosure can be applicable to any type of mobile terminal, without being limited to the slide-type mobile terminal.

The mobile terminal 100 as shown in FIG. 9 may be configured to operate with a communication system, which transmits data via frames or packets, such as wired and wireless communication systems, as well as satellite-based communication systems.

Such communication systems in which the mobile terminal according to an embodiment of the present disclosure can operate will now be described with reference to FIG. 10.

These communication systems may use different air interfaces and/or physical layers. For example, air interfaces utilized by the communication systems include example, frequency division multiple access (FDMA), time division multiple access (TDMA), code division multiple access (CDMA), and universal mobile telecommunications system (UMTS) (in particular, long term evolution (LTE)), global system for mobile communications (GSM), and the like. As a non-limiting example, the description hereafter relates to a CDMA communication system, but such teachings apply equally to other types of systems.

Figure 2:
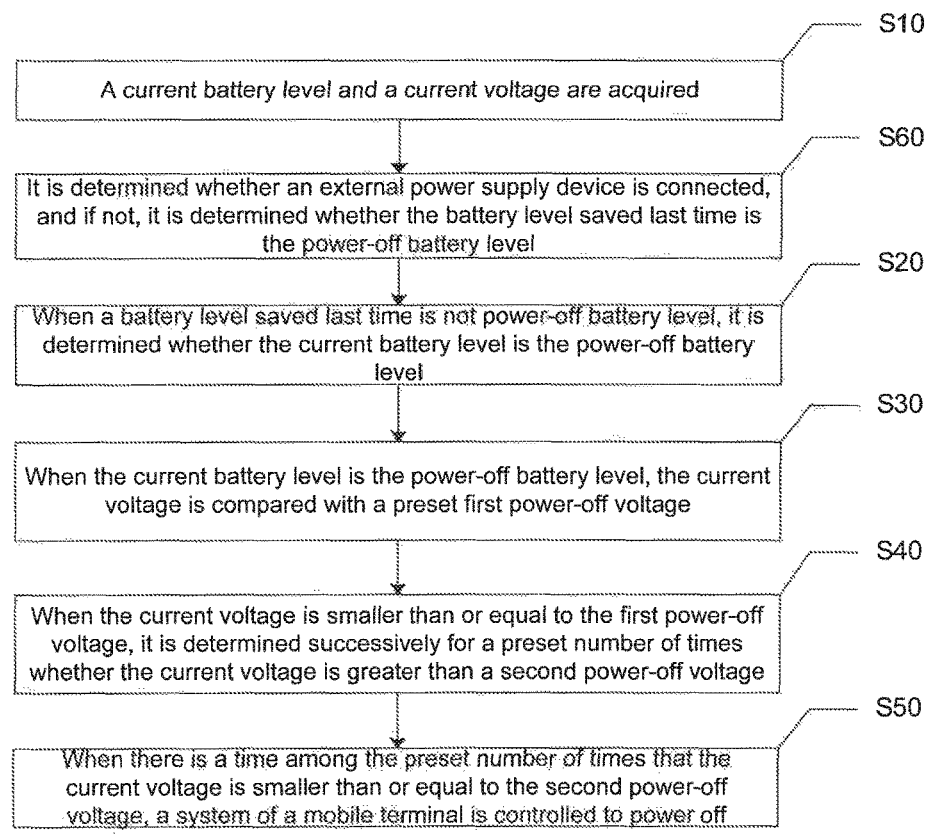
FIG. 2 is a flowchart of a battery level management method according to a second embodiment of the present disclosure.
Figure 10:
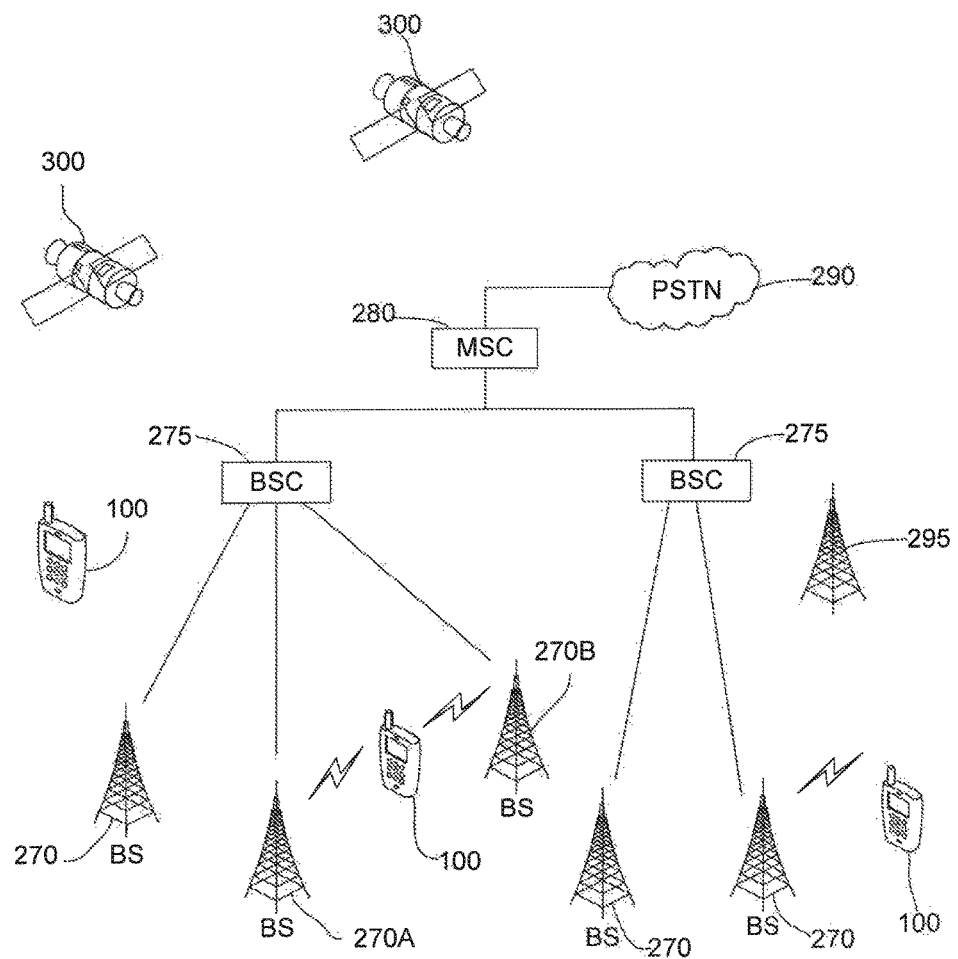
FIG. 10 is a structure diagram of a system where a mobile terminal provided by an embodiment of the present disclosure may be applied.

Referring to FIG. 10, a CDMA wireless communication system may include a plurality of mobile terminals 100, a plurality of base stations (BSs) 270, base station controllers (BSCs) 275, and a mobile switching center (MSC) 280. The MSC 280 is configured to interface with a public switch telephone network (PSTN) 290. The MSC 280 is also configured to interface with the BSCs 275, which may be coupled to the base stations 270 via backhaul lines. The backhaul lines may be configured in accordance with any of several known interfaces including, for example, E1/T1, ATM, IP, PPP, Frame Relay, HDSL, ADSL, or xDSL. It is to be understood that the system as shown in FIG. 2 may include a plurality of BSCs 275.

Each BS 270 may serve one or more sectors (or regions), each sector covered by an omni-directional antenna or an antenna pointed in a particular direction radially away from the BS 270. Alternatively, each sector may be covered by two or more antennas for diversity reception. Each BS 270 may be configured to support a plurality of frequency assignments, and each frequency assignment has a particular spectrum (e.g., 1.25 MHz, 5 MHz, etc).

The intersection of a sector and frequency assignment may be referred to as a CDMA channel. The BS 270 may also be referred to as base station transceiver subsystems (BTSs) or other equivalent terms. In this situation, the term "base station" may be used to collectively refer to a single BSC 275 and at least one BS 270. The base station may also be referred to as a "cell site". Alternatively, individual sectors of a particular BS 270 may be referred to as a plurality of cell sites.

Figure 1:
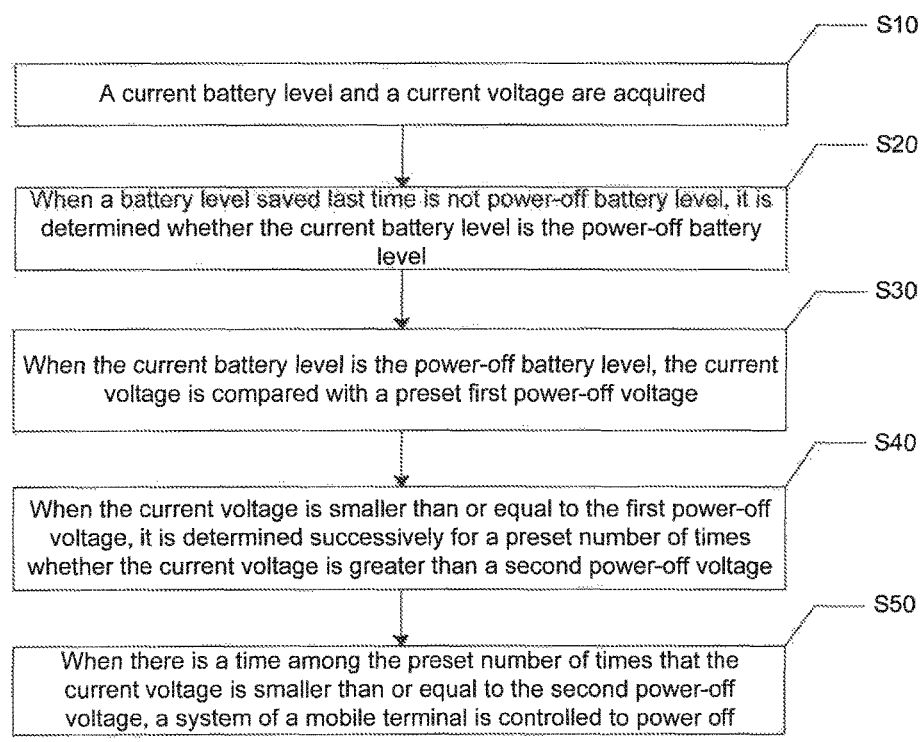
FIG. 1 is a flowchart of a battery level management method according to a first embodiment of the present disclosure.

As shown in FIG. 10, a broadcasting transmitter (BT) 295 transmits a broadcast signal to the mobile terminals 100 operating within the system. The broadcast receiving module 111 as shown in FIG. 1 is provided at the terminal 100 to receive broadcast signals transmitted by the BT 295. In FIG. 2, several global positioning systems (GPS) satellites 300 are shown. The satellites 300 help locate at least one of a plurality of terminals 100.

In FIG. 10, several satellites 300 are depicted, but it is understood that useful positioning information may be obtained with any number of satellites. The GPS module 115 as shown in FIG. 1 is typically configured to cooperate with the satellites 300 to obtain desired positioning information. Instead of or in addition to GPS tracking techniques, other technologies that may track the location of the mobile terminals may be used. In addition, at least one of the GPS satellites 300 may selectively or additionally handle satellite DMB transmissions.

As one typical operation of the wireless communication system, the BSs 270 receive reverse-link signals from various mobile terminals 100. The mobile terminals 100 typically engaging in calls, messaging, and other types of communications. Each reverse-link signal received by a particular base station 270 is processed within the particular BS 270. The resulting data is forwarded to an associated BSC 275. The BSC provides call resource allocation and mobility management functionality including the coordination of soft handoff procedures between BSs 270. The BSCs 275 also route the received data to the MSC 280, which provides additional routing services for interfacing with the PSTN 290. Similarly, the PSTN 290 interfaces with the MSC 280, the MSC interfaces with the BSCs 275, and the BSCs 275 in turn control the BSs 270 to transmit forward-link signals to the mobile terminals 100.

Preferred embodiments of the present disclosure will be elaborated hereinbelow in conjunction with the accompanying drawings. It should be understood that specific embodiments described herein are only intended to explain the present disclosure, and are not limitative of the present disclosure.

The embodiments of the present disclosure provide a battery level management method.

Referring to FIG. 1, FIG. 1 is a flowchart of a battery level management method according to a first embodiment of the present disclosure.

In an embodiment, the battery level management method includes the following steps.

Step S10: A current battery level and a current voltage are acquired.

Step S20: When a battery level saved last time is not power-off battery level, it is determined whether the current battery level is the power-off battery level. If so, Step S30 is executed.

Battery level acquisition time interval may be preset to determine whether a mobile terminal is powered off with the battery level. That is, a current battery level and current voltage of a battery are acquired once at each battery level acquisition time interval, and it is further determined whether to control a system of the mobile terminal to power off according to the acquired current battery level and current voltage. Before the battery level of the mobile terminal is detected, the current battery level and current voltage of the battery are acquired, and a battery level saved last time is acquired, the battery level saved last time being a battery level of the battery acquired last time. When it is determined that the battery level saved last time is not power-off battery level, it is further determined whether the acquired current battery level is the power-off battery level. In the present embodiment, the power-off battery level may be self-defined by a user, or default zero electricity of the mobile terminal may be adopted as the power-off battery level.

Step S30: The current voltage is compared with a preset first power-off voltage, and if the current voltage is smaller than or equal to the first power-off voltage, Step S40 is executed.

Step S40: It is determined successively for a preset number of times whether the current voltage is greater than a second power-off voltage. If so, Step S50 is executed.

Step S50: A system of a mobile terminal is controlled to power off.

When the current battery level is equal to the power-off battery level, the current voltage is compared with the preset first power-off voltage. That is, it is determined whether the current voltage is greater than the first power-off voltage. The first power-off voltage may also be self-defined by the user. If the current voltage is smaller than or equal to the first power-off voltage, the current voltage is further compared with a second power-off voltage. In the present embodiment, it is determined successively for a preset number of times whether the current voltage is greater than the second power-off voltage, and the number of times may be set by the user according to actual situations. For example, it may be set to determine whether the current voltage is greater than the second power-off voltage for successive N times. If it is determined that there is a time among the preset number of times that the current voltage is smaller than or equal to the second power-off voltage, that is, if the current voltage is determined to be smaller than the second power-off voltage at least once among the preset number of times, it is shown that the current battery level has reached the power-off battery level, and in this case, the system of the mobile terminal is controlled to power off.

In the present embodiment, when the current battery level is acquired and it is determined that the battery level saved last time is not the power-off battery level, it is determined whether the current battery level is the power-off battery level, if so, the current voltage is compared with the preset first power-off voltage, if the current battery level is smaller than or equal to the first power-off voltage, it is determined successively for the preset number of times whether the current battery level is greater than the second power-off voltage, and if not so, the system of the mobile terminal is controlled to power off. The acquired current battery level is compared with the first power-off voltage and the second power-off voltage, and a corresponding criterion is set to determine whether to control the system of the mobile terminal to power off. The power-off battery level of the mobile terminal can be accurately determined, so that the battery electricity can be fully utilized, and the use experience of the user is improved.

Referring to FIG. 2, FIG. 2 is a flowchart of a battery level management method according to a second embodiment of the present disclosure.

On the basis of the first embodiment of the battery level management method of the present disclosure, in the second embodiment, after Step S10 is executed, the method further includes the following step.

Step S60: It is determined whether an external power supply device is connected, and if not, it is determined whether the battery level saved last time is the power-off battery level.

In the present embodiment, after the current battery level of the battery of the mobile terminal is acquired, it is firstly determined whether the mobile terminal is connected with the external power supply device. If so, other determination will not be performed, and after the battery level acquisition time interval, a current battery level is re-acquired and determination is performed. If not, the battery level saved last time is acquired, and it is determined whether the battery level saved last time is the power-off battery level. When it is determined that the battery level saved last time is the power-off battery level, it is shown that the battery level of the mobile terminal has been as low as the power-off battery level, and in this case, the system of the mobile terminal is controlled to power off.

After the current battery level is acquired, it is firstly determined whether the mobile terminal is connected with the external power supply device, and if not, the battery level saved last time is further acquired and it is determined whether the battery level saved last time is the power-off battery level, thereby further ensuring accurate determination on the power-off battery level of the mobile terminal.

Figure 3:
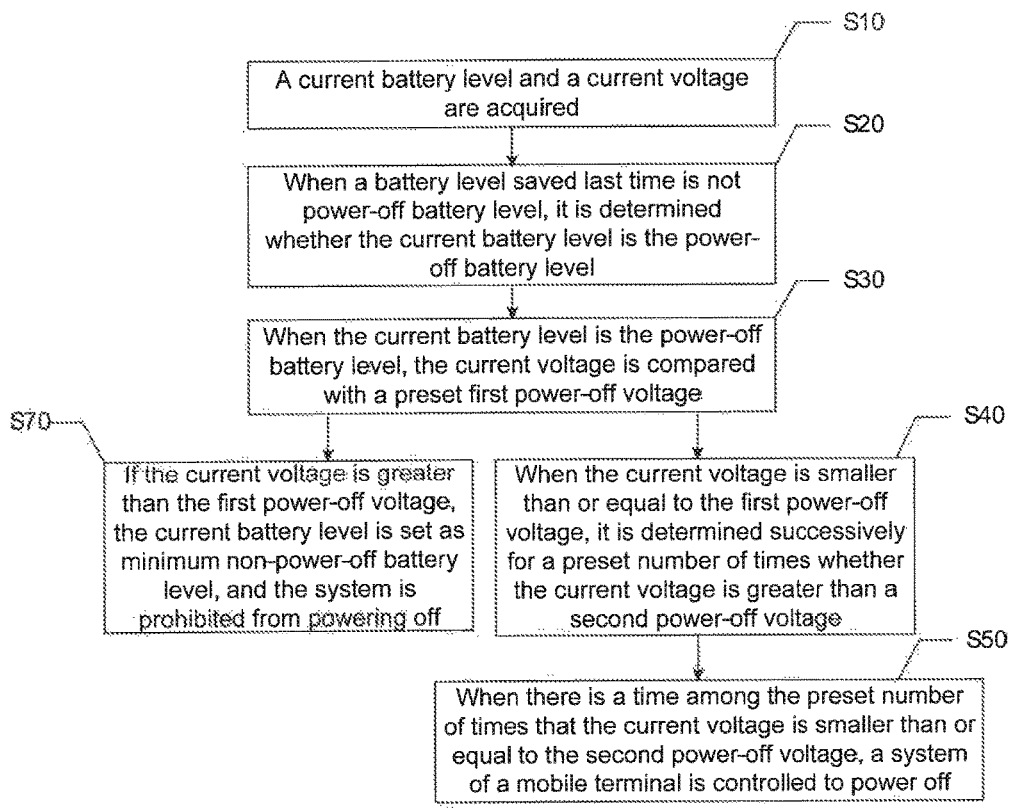
FIG. 3 is a flowchart of a battery level management method according to a third embodiment of the present disclosure.

Referring to FIG. 3, FIG. 3 is a flowchart of a battery level management method according to a third embodiment of the present disclosure.

On the basis of the first and second embodiments of the battery level management method of the present disclosure, in the third embodiment, after Step S30 is executed, the method further includes the following step.

Step S70: If the current voltage is greater than the first power-off voltage, the current battery level is set as minimum non-power-off battery level, and the system is prohibited from powering off.

When the current voltage is compared with the first power-off voltage and it is determined that the current voltage is greater than the first power-off voltage, it is shown that the battery still has some usable electricity at this time, the current battery level is set as minimum non-power-off battery level. That is, the current battery level at this time is set as minimum battery level for prohibiting the system from powering off, and the system is prohibited from powering off. The set minimum non-power-off battery level is identical to the current battery level, so the magnitude thereof is not fixed.

When the current voltage is compared with the first power-off voltage and it is determined that the current voltage is greater than the first power-off voltage, the current battery level is set as the minimum non-power-off battery level, and the system is prohibited from powering off, so it is further ensured that the battery electricity can be fully utilized.

Figure 4:
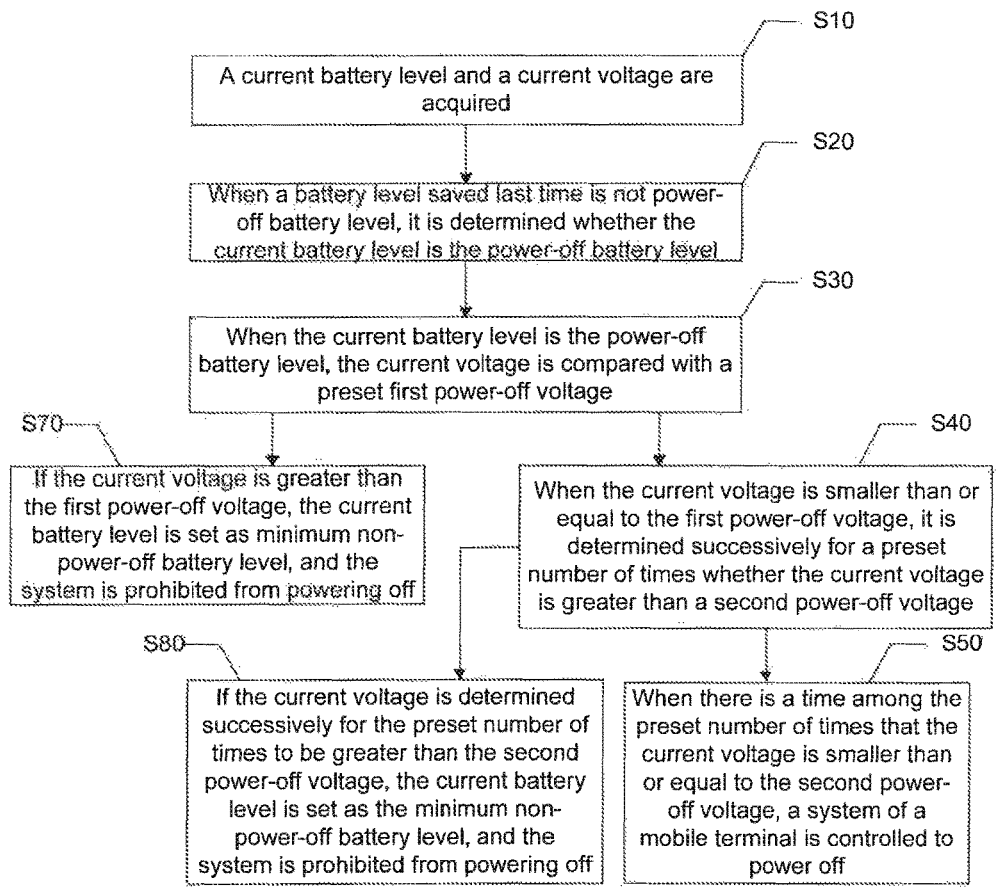
FIG. 4 is a flowchart of a battery level management method according to a fourth embodiment of the present disclosure.

Referring to FIG. 4, FIG. 4 is a flowchart of a battery level management method according to a fourth embodiment of the present disclosure.

On the basis of the above-mentioned embodiments of the battery level management method of the present disclosure, in the fourth embodiment, after Step S40 is executed, the method further includes the following step.

Step S80: If the current voltage is determined successively for the preset number of times to be greater than the second power-off voltage, the current battery level is set as the minimum non-power-off battery level, and the system is prohibited from powering off.

When the current voltage is smaller than the first power-off voltage and the current voltage is determined successively for the preset number of times to be greater than the second power-off voltage, that is, the current voltage determined at each time among the preset number of times is greater than the second power-off voltage, it is shown that the current battery level does not reach the power-off battery level, and the battery still has some usable electricity at this time. In this case, the current battery level is set as the minimum battery level for prohibiting the system from powering off, and the system is prohibited from powering off.

When the current voltage is smaller than the first power-off voltage and the current voltage is determined successively for the preset number of times to be greater than the second power-off voltage, the current battery level is set as the minimum non-power-off battery level, and the system is prohibited from powering off, so it is further ensured that the battery electricity can be fully utilized.

The embodiments of the present disclosure also provide a mobile terminal.

Figure 5:
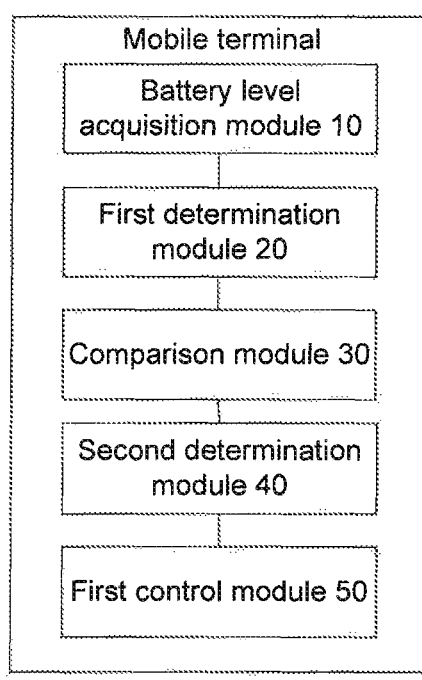
FIG. 5 is a structure diagram of a mobile terminal according to a first embodiment the present disclosure.

Referring to FIG. 5, FIG. 5 is a structure diagram of a first embodiment of a mobile terminal according to the present disclosure.

In an embodiment, the mobile terminal includes:

a battery level acquisition module 10 configured to acquire a current battery level and a current voltage;

a first determination module 20 configured to determine, when a battery level saved last time is not power-off battery level, whether the current battery level is the power-off battery level;

a comparison module 30 configured to compare, when the current battery level is the power-off battery level, the current voltage with a preset first power-off voltage;

a second determination module 40 configured to, if the current voltage is smaller than or equal to the first power-off voltage, determine successively for a preset number of times whether the current voltage is greater than a second power-off voltage; and a first control module 50 configured to, if there is a time among the preset number of times that the current voltage is smaller than or equal to the second power-off voltage, control a system of the mobile terminal to power off.

Battery level acquisition time interval may be preset to determine whether a mobile terminal is powered off with the battery level. That is, a current battery level and current voltage of a battery are acquired once at each battery level acquisition time interval, and it is further determined whether to control a system of the mobile terminal to power off according to the acquired current battery level and current voltage. Before the battery level of the mobile terminal is detected, the battery level acquisition module 10 acquires the current battery level and current voltage of the battery, and acquires a battery level saved last time, the battery level saved last time being a battery level of the battery acquired last time. When it is determined that the battery level saved last time is not power-off battery level, the first determination module 20 further determines whether the acquired current battery level is the power-off battery level. In the present embodiment, the power-off battery level may be self-defined by a user, or default zero electricity of the mobile terminal may be adopted as the power-off battery level.

When the current battery level is equal to the power-off battery level, the comparison module 30 compares the current voltage with the preset first power-off voltage. That is, it is determined whether the current voltage is greater than the first power-off voltage. The first power-off voltage may also be self-defined by the user. If the current voltage is smaller than or equal to the first power-off voltage, the second determination module 40 further compares the current voltage with a second power-off voltage. In the present embodiment, it is determined successively for a preset number of times whether the current voltage is greater than the second power-off voltage, and the number of times may be set by the user according to actual situations. For example, it may be set to determine whether the current voltage is greater than the second power-off voltage for successive N times. If it is determined that there is a time among the preset number of times that the current voltage is smaller than or equal to the second power-off voltage, that is, if the current voltage is determined to be smaller than the second power-off voltage at least once among the preset number of times, it is shown that the current battery level has reached the power-off battery level, and in this case, the first control module 50 controls the system of the mobile terminal to power off.

In the present embodiment, when the current battery level is acquired and it is determined that the battery level saved last time is not the power-off battery level, it is determined whether the current battery level is the power-off battery level, if so, the current voltage is compared with the preset first power-off voltage, if the current battery level is smaller than or equal to the first power-off voltage, it is determined successively for the preset number of times whether the current battery level is greater than the second power-off voltage, and if not so, the system of the mobile terminal is controlled to power off. The acquired current battery level is compared with the first power-off voltage and the second power-off voltage, and a corresponding criterion is set to determine whether to control the system of the mobile terminal to power off. The power-off battery level of the mobile terminal can be accurately determined, so that the battery electricity can be fully utilized, and the use experience of the user is improved.

Figure 6:
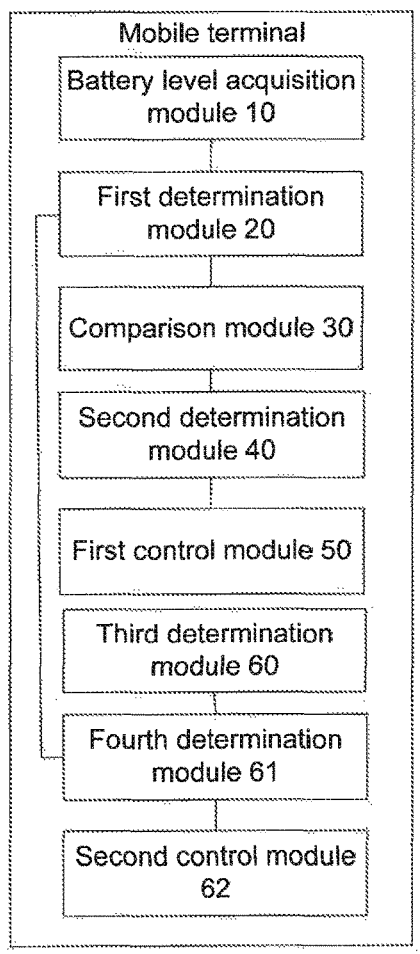
FIG. 6 is a structure diagram of a mobile terminal according to a second embodiment of the present disclosure.

Referring to FIG. 6, FIG. 6 is a structure diagram of a second embodiment of a mobile terminal according to the present disclosure.

On the basis of the first embodiment of the mobile terminal of the present disclosure, in the second embodiment, the mobile terminal further includes:

a third determination module 60 configured to determine whether an external power supply device is connected;

a fourth determination module 61 configured to determine, when the mobile terminal is not connected with the external power supply device, whether the battery level saved last time is the power-off battery level; and a second control module 62 configured to control, when the battery level saved last time is the power-off battery level, the system of the mobile terminal to power off. During specific implementation, the fourth determination module 61 is configured to determine, when the mobile terminal is not connected with the external power supply device, whether the battery level saved last time is the power-off battery level.

In the present embodiment, after the current battery level of the battery of the mobile terminal is acquired, the third determination module 60 firstly determines whether the mobile terminal is connected with the external power supply device. If so, other determination will not be performed, and after the battery level acquisition time interval, a current battery level is re-acquired and determination is performed. If not, the battery level saved last time is acquired, and the fourth determination module 61 determines whether the battery level saved last time is the power-off battery level. When it is determined that the battery level saved last time is the power-off battery level, it is shown that the battery level of the mobile terminal has been as low as the power-off battery level, and in this case, the second control module 62 controls the system of the mobile terminal to power off.

After the current battery level is acquired, it is firstly determined whether the mobile terminal is connected with the external power supply device, and if not, the battery level saved last time is further acquired and it is determined whether the battery level saved last time is the power-off battery level, thereby further ensuring accurate determination on the power-off battery level of the mobile terminal.

Figure 7:
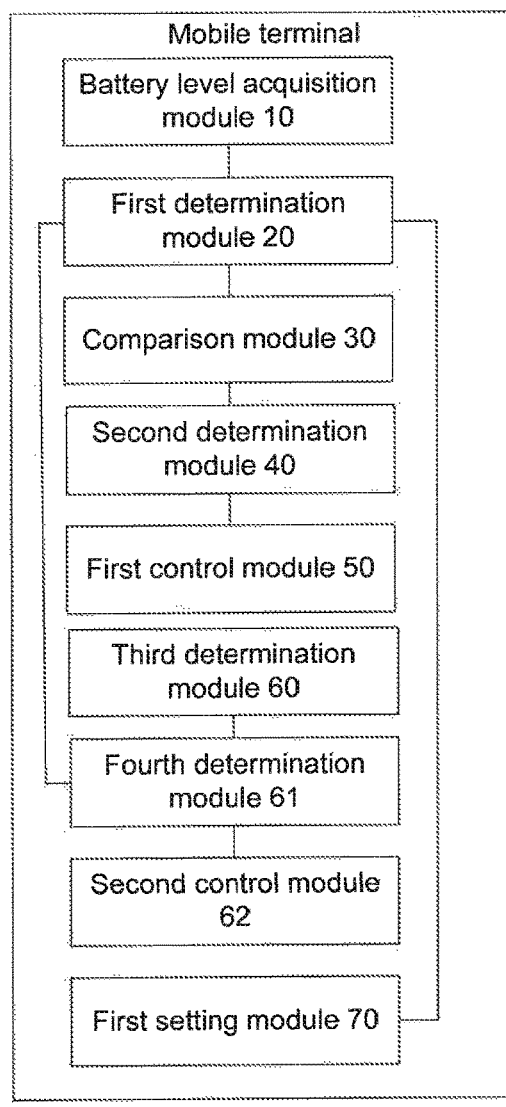
FIG. 7 is a structure diagram of a mobile terminal according to a third embodiment of the present disclosure.

Referring to FIG. 7, FIG. 7 is a structure diagram of a third embodiment of a mobile terminal according to the present disclosure.

On the basis of the first and second embodiments of the mobile terminal of the present disclosure, in the third embodiment, the mobile terminal further includes:

a first setting module 70 configured to set, if the current voltage is greater than the first power-off voltage, the current battery level as minimum non-power-off battery level, and prohibit the system from powering off.

When the current voltage is compared with the first power-off voltage and it is determined that the current voltage is greater than the first power-off voltage, it is shown that the battery still has some usable electricity at this time, the first setting module 70 sets the current battery level as minimum non-power-off battery level. That is, the current battery level at this time is set as minimum battery level for prohibiting the system from powering off, and the system is prohibited from powering off. The set minimum non-power-off battery level is identical to the current battery level, so the magnitude thereof is not fixed.

When the current voltage is compared with the first power-off voltage and it is determined that the current voltage is greater than the first power-off voltage, the current battery level is set as the minimum non-power-off battery level, and the system is prohibited from powering off, so it is further ensured that the battery electricity can be fully utilized.

Figure 8:
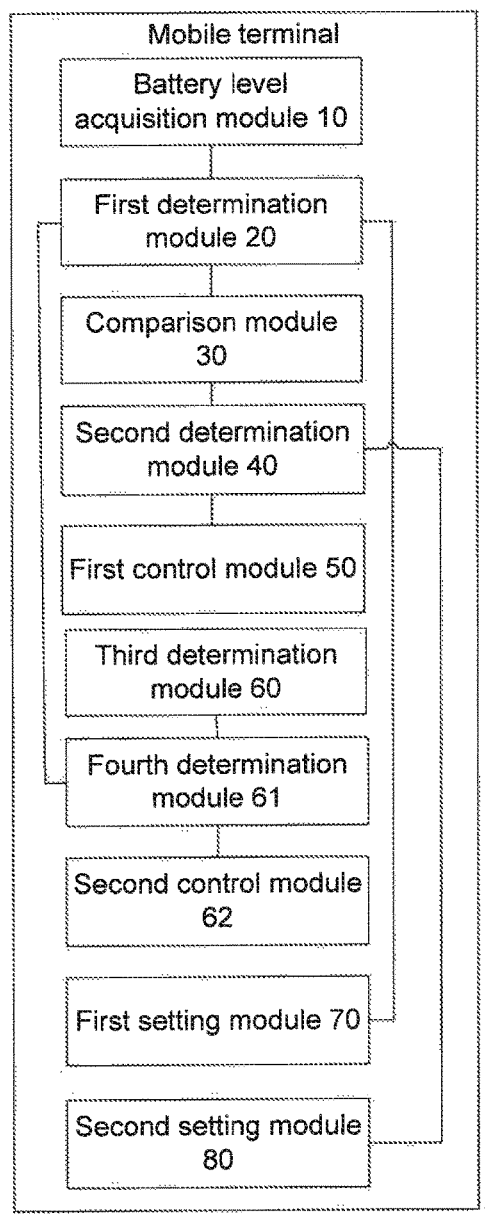
FIG. 8 is a structure diagram of a mobile terminal according to a fourth embodiment of the present disclosure.

Referring to FIG. 8, FIG. 8 is a structure diagram of a fourth embodiment of a mobile terminal according to the present disclosure.

On the basis of the above-mentioned embodiments of the mobile terminal of the present disclosure, in the fourth embodiment, the mobile terminal further includes:

a second setting module 80 configured to, if the current voltage is determined successively for the preset number of times to be greater than the second power-off voltage, set the current battery level as the minimum non-power-off battery level, and prohibit the system from powering off.

When the current voltage is smaller than the first power-off voltage and the current voltage is determined successively for the preset number of times to be greater than the second power-off voltage, that is, the current voltage determined at each time among the preset number of times is greater than the second power-off voltage, it is shown that the current battery level does not reach the power-off battery level, and the battery still has some usable electricity at this time. In this case, the second setting module 80 sets the current battery level as the minimum battery level for prohibiting the system from powering off, and prohibits the system from powering off.

When the current voltage is smaller than the first power-off voltage and the current voltage is determined successively for the preset number of times to be greater than the second power-off voltage, the current battery level is set as the minimum non-power-off battery level, and the system is prohibited from powering off, so it is further ensured that the battery electricity can be fully utilized.

In the embodiments of the present disclosure, another battery level management method is also provided. The battery level management method includes the following steps.

A current battery level and a current voltage are acquired, and when a battery level saved last time is not power-off battery level, it is determined whether the current battery level is the power-off battery level.

When the current battery level is the power-off battery level, the current voltage is compared with a preset first power-off voltage.

If the current voltage is smaller than or equal to the first power-off voltage, it is determined whether the current voltage is greater than a second power-off voltage for successive N times, N being an integer not smaller than 2.

If the current voltage is smaller than the second power-off voltage at least once, a system of a mobile terminal is controlled to power off.

In the present embodiment, the current battery level will be compared with the power-off battery level firstly, and then the current voltage is utilized to be compared with the first power-off voltage and the second power-off voltage. In order to avoid voltage fluctuation in a use process of the mobile terminal, the current voltage will be compared with the first power-off voltage and the second power-off voltage separately in the present embodiment. When the current voltage is compared with the second power-off voltage, determination and comparison need to be performed for at least N times, and therefore it can be accurately determined whether the mobile terminal truly enters a power-off state at present, thereby avoiding, to the greatest extent, the phenomena of interruption of user communication and the like caused by the fact that the mobile terminal enters the power-off state when there is still usable electricity or voltage.

As a further improvement of the present embodiment, the method further includes that: time interval is acquired. The step that the current battery level and the current voltage are acquired includes that: the current battery level and the current voltage are acquired once at each time interval.

The time interval may be preset time such as an interval period. Thus, the current voltage and current electricity of the mobile terminal can be accurately and continuously monitored, and the power-on and power-off states of the mobile terminal can be accurately controlled.

A value of the first power-off voltage is greater than a value of the second power-off voltage. The value of the first power-off voltage is greater than the value of the second power-off voltage, so it can be ensured that the electricity in the mobile terminal is fully exhausted before the mobile terminal enters the power-off state.

Besides, the method further includes the following steps.

If the current voltage is not smaller than the second power-off voltage for successive N times, the mobile terminal is controlled to turn from a first working state to a second working state, wherein the electricity consumption of the mobile terminal working in the first working state is greater than that of the mobile terminal working in the second working state.

In the present embodiment, the number of applications probably started under the first working state may be greater than that of applications started under the second working state. Executable operations of the mobile terminal under the first working state can be more than executable operations of the mobile terminal under the second working state. For example, under the first working state, the mobile terminal can play a video or make a video call; and under the second working state, in order to ensure the endurance of the mobile terminal, response to a video playing operation and/or a video call operation is probably prohibited.

Besides, the working state of the mobile terminal includes a power-on state and a power-off state, and the first working state and the second working state are sub-states under the power-on state respectively.

Under the power-off state, the mobile terminal cannot be used for calling and Internet-surfing. Obviously, the power-on state is a state where energy is saved to the greatest extent, but it may probably cause that the mobile terminal cannot achieve functions thereof. The first working state and the second working state in the present embodiment are both non-power-off states, and belong to the power-on state. Thus, the endurance of the mobile terminal can be prolonged, and it can be at least ensured that the mobile terminal achieves some of the functions.

In the present embodiment, the functions of the mobile terminal may be divided into basic functions and additional functions. The basic functions may include a communication function and other most basic functions of the mobile terminal. The mobile terminal under the second working state at least can achieve the basic functions.

Besides, the method further includes the following steps.

It is determined whether an electronic device has an external power supply device.

A power supply rate of the external power supply device is determined.

According to the power supply rate, the mobile terminal is controlled to be switched between the first working state and the second working state.

The external power supply device here may be any electronic device capable of supplying electricity to the mobile terminal.

In the present embodiment, the power supply rate of the external power supply device is determined. The power supply rate here may be understood as supplying electricity to the mobile terminal within unit time.

If the power consumption rate of the mobile terminal is greater than the power supply rate, it is difficult for the mobile terminal to accumulate electricity. So, in the present embodiment, it is determined whether the power supply rate is smaller than a specified rate, if so, the mobile terminal is kept to work in the low-power-consumption second working state for a period of time, and after the mobile terminal accumulates sufficient electricity, the second working state is switched to the first working state. Thus, the mobile terminal is prevented from working in the high-power-consumption first working state, thus eliminating power supply of the external power supply device.

Further, the step that the mobile terminal is controlled to be switched between the first working state and the second working state according to the power supply rate includes that:

if the power supply rate is smaller than the specified rate, the mobile terminal is kept to work in the second working state within a specified period of time, and the working state of the mobile terminal is switched to the first working state after the specified period of time elapses.

The specified rate here may be dynamically determined. For example, the specified rate here may be determined according to a current power supply rate of the mobile terminal. For another example, the specified rate may be determined according to an average power supply rate of the mobile terminal working under the first state. The specified rate may be equal to the current power supply rate or may be equal to the average power supply rate.

Thus, advantageously, the mobile terminal may quickly accumulate the electricity for further continuous standby.

Certainly, if the power supply rate is not smaller than the specified rate, the working state of the mobile terminal is switched to the first working state. Thus, all of the functions of the mobile terminal are recovered as quickly as possible, better service is provided for the user, and the use satisfaction of the user is improved.

Certainly, the method further includes that: if the current voltage is not smaller than the second power-off voltage for successive N times, the system of the mobile terminal is prohibited from powering off. Thus, the phenomenon of bad use satisfaction of the user caused by untimely power-off may be avoided.

The embodiments of the present disclosure also provide a computer storage medium. A computer-executable instruction is stored in the computer storage medium. The computer-executable instruction is configured to execute at least one of the above-mentioned methods as shown in FIG. 1 to FIG. 4.

The computer storage medium in the present embodiment may be a storage medium such as an optical disk, a mobile hard disk, a flash disk or a magnetic tape. The computer storage medium in the present embodiment may be a non-instant storage medium. The above is only the preferred embodiments of the present disclosure and not thus limitative of the patent scope of the present disclosure. Modifications made in accordance with the principle of the present disclosure shall be understood as falling within the scope of protection of the present disclosure.

What is claimed is:

1. A battery level management method, comprising the following steps:
   acquiring a current battery level and a current voltage;
   when a battery level saved last time is not a power-off battery level, determining whether the current battery level is the power-off battery level;
   when the current battery level is the power-off battery level, comparing the current voltage with a preset first power-off voltage;
   if the current voltage is smaller than or equal to the first power-off voltage, determining successively for a preset number of times whether the current voltage is greater than a second power-off voltage; and
   if there is a time among the preset number of times that the current voltage is smaller than or equal to the second power-off voltage, controlling a system of a mobile terminal to power off.

2. The battery level management method according to claim 1, further comprising: after acquiring the current battery level and the current voltage,
   determining whether an external power supply device is connected, and if not, determining whether the battery level saved last time is the power-off battery level.

3. The battery level management method according to claim 2, further comprising: after determining whether the battery level saved last time is the power-off battery level,
   when the battery level saved last time is the power-off battery level, controlling the system of the mobile terminal to power off.

4. The battery level management method according to claim 3, further comprising: after comparing the current voltage with the preset first power-off voltage,
   if the current voltage is greater than the first power-off voltage, setting the current battery level as minimum non-power-off battery level, and prohibiting the system from powering off.

5. The battery level management method according to claim 4, further comprising: after determining successively for the preset number of times whether the current voltage is greater than the second power-off voltage,
   if the current voltage is determined successively for the preset number of times to be greater than the second power-off voltage, setting the current battery level as the minimum non-power-off battery level, and prohibiting the system from powering off.

6. A mobile terminal, comprising:
   a memory storing processor-executable instructions; and
   a processor arranged to execute the stored processor-executable instructions to perform steps of:
   acquiring a current battery level and a current voltage;
   when a battery level saved last time is not power-off battery level, determining whether the current battery level is the power-off battery level;
   when the current battery level is the power-off battery level, comparing the current voltage with a preset first power-off voltage;
   if the current voltage is smaller than or equal to the first power-off voltage, determining successively for a preset number of times whether the current voltage is greater than a second power-off voltage; and
   if there is a time among the preset number of times that the current voltage is smaller than or equal to the second power-off voltage, controlling a system of the mobile terminal to power off.

7. The mobile terminal according to claim 6, wherein the processor is arranged to execute the stored processor-executable instructions to further perform steps of:
   after acquiring the current battery level and the current voltage, determining whether an external power supply device is connected, an if not, determining whether the battery level saved last time is the power-off battery level.

8. The mobile terminal according to claim 7, wherein the processor is arranged to execute the stored processor-executable instructions to further perform a step of:
   after determining whether the battery level saved last time is the power-off battery level , when the battery level saved last time is the power-off battery level, controlling the system of the mobile terminal to power off.

9. The mobile terminal according to claim 8, wherein the processor is arranged to execute the stored processor-executable instructions to further perform steps:
   after comparing the current voltage with the preset first power-off voltage , if the current voltage is greater than the first power-off voltage, setting the current battery level as minimum non-power-off battery level, and prohibiting the system from powering off.

10. The mobile terminal according to claim 9, wherein the processor is arranged to execute the stored processor-executable instructions to further perform steps:
    after determining successively for the preset number of times whether the current voltage is greater than the second power-off voltage , if the current voltage is determined successively for the preset number of times to be greater than the second power-off voltage, setting the current battery level as the minimum non-power-off battery level, and prohibiting the system from powering off.

11. A battery level management method, comprising:
    acquiring a current battery level and a current voltage, and when a battery level saved last time is not power-off battery level, determining whether the current battery level is the power-off battery level;
    when the current battery level is the power-off battery level, comparing the current voltage with a preset first power-off voltage;
    if the current voltage is smaller than or equal to the first power-off voltage, determining whether the current voltage is greater than a second power-off voltage for successive N times, N being an integer not smaller than 2; and
    if the current voltage is smaller than the second power-off voltage at least once, controlling a system of a mobile terminal to power off.

12. The method according to claim 11, further comprising:
    acquiring a time interval; and
    acquiring the current battery level and the current voltage comprises:
    acquiring the current battery level and the current voltage once at each time interval.

13. The method according to claim 11, wherein
    a value of the first power-off voltage is greater than a value of the second power-off voltage.

14. The method according to claim 11, further comprising:
    if the current voltage is not smaller than the second power-off voltage for successive N times, controlling the mobile terminal to turn from a first working state to a second working state, wherein the electricity consumption of the mobile terminal working in the first working state is greater than the electricity consumption of the mobile terminal working in the second working state.

15. The method according to claim 14, wherein a working state of the mobile terminal comprises a power-on state and a power-off state; and the first working state and the second working state are both sub-states under the power-on state.

16. The method according to claim 14, further comprising:

determining whether the mobile terminal is connected to an external power supply device;

determining a power supply rate of the external power supply device; and controlling, according to the power supply rate, the mobile terminal to be switched between the first working state and the second working state.

17. The method according to claim 16, wherein controlling, according to the power supply rate, the mobile terminal to be switched between the first working state and the second working state comprises:

if the power supply rate is smaller than a specified rate, keeping the mobile terminal to work in the second working state within a specified period of time, and switching the working state of the mobile terminal to the first working state after the specified period of time elapses.

18. The method according to claim 16, wherein if the power supply rate is not smaller than the specified rate, the working state of the mobile terminal is switched to the first working state.

19. The method according to claim 11, further comprising:

if the current voltage is not smaller than the second power-off voltage for successive N times, prohibiting the system of the mobile terminal from powering off.

* * * * *